(12) United States Patent
Nelson et al.

(10) Patent No.: US 7,724,521 B2
(45) Date of Patent: May 25, 2010

(54) SYSTEMS AND METHODS FOR VENTURI FAN-ASSISTED COOLING

(75) Inventors: Michael J. Nelson, Prior Lake, MN (US); Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 49 days.

(21) Appl. No.: 12/137,309

(22) Filed: Jun. 11, 2008

(65) Prior Publication Data
US 2009/0310301 A1 Dec. 17, 2009

(51) Int. Cl.
*H05K 7/20* (2006.01)
(52) U.S. Cl. .................. 361/695; 361/690; 361/694; 454/184
(58) Field of Classification Search .................. None
See application file for complete search history.

(56) References Cited

U.S. PATENT DOCUMENTS

| | | | |
|---|---|---|---|
| 4,742,864 A | 5/1988 | Duell et al. | |
| 5,894,407 A * | 4/1999 | Aakalu et al. | 361/695 |
| 5,946,193 A * | 8/1999 | Hendrix et al. | 361/704 |
| 6,065,612 A | 5/2000 | Rinderer | |
| 6,082,441 A | 7/2000 | Boehmer et al. | |
| 6,142,595 A * | 11/2000 | Dellapi et al. | 312/326 |
| 6,238,027 B1 | 5/2001 | Kohler et al. | |
| 6,253,834 B1 | 7/2001 | Sterner | |
| 6,310,772 B1 * | 10/2001 | Hutchison et al. | 361/700 |
| 6,788,535 B2 * | 9/2004 | Dodgen et al. | 361/695 |
| 6,968,647 B2 | 11/2005 | Levesque et al. | |
| 6,995,978 B2 * | 2/2006 | Strauss | 361/688 |
| 7,027,300 B2 * | 4/2006 | Lord | 361/695 |
| 7,225,586 B2 | 6/2007 | Levesque et al. | |
| 7,245,485 B1 * | 7/2007 | Morrell | 361/679.48 |
| 7,355,848 B1 * | 4/2008 | Hodge et al. | 361/690 |
| 7,450,382 B1 * | 11/2008 | Fischer et al. | 361/695 |
| 2006/0279927 A1 | 12/2006 | Strohm | |
| 2007/0247809 A1 | 10/2007 | McClure | |
| 2008/0238270 A1 * | 10/2008 | Wayman et al. | 312/199 |
| 2008/0239632 A1 * | 10/2008 | Wayman | 361/600 |
| 2008/0278912 A1 * | 11/2008 | Zavadsky et al. | 361/697 |

* cited by examiner

*Primary Examiner*—Gregory D Thompson
(74) *Attorney, Agent, or Firm*—Fogg & Powers LLC (57) ABSTRACT

Systems and methods for Venturi fan-assisted cooling of electrical equipment are provided. In one embodiment, a cooling unit for an enclosure housing electronics is provided. The cooling unit comprises: a fan shroud having at least one electrical fan; and a Venturi chamber having a first inlet for receiving a heated airflow from a heatsink, a second inlet for receiving an airflow from a surrounding environment, and an outlet coupled to the fan shroud, the fan drawing air from the Venturi chamber via the outlet when the fan is on. The Venturi chamber comprises a wall for directing the airflow air from the surrounding environment in from the second inlet and across the heated airflow from the heatsink in a manner to as to draw the heated airflow through the heatsink using a Venturi effect, when the fan is on.

20 Claims, 10 Drawing Sheets

SYSTEMS AND METHODS FOR VENTURI FAN-ASSISTED COOLING

CROSS REFERENCE TO RELATED APPLICATION(S)

This application is related to the following commonly assigned U.S. patent applications, filed on even date herewith, each of which is incorporated herein by reference in its entirety, all of which are hereby incorporated herein by reference:

U.S. patent application Ser. No. 12/137,322 (entitled "COMMUNICATION MODULES") and which is referred to here as the '1027 Application;

U.S. patent application Ser. No. 12/137,297 (entitled "APPARATUS FOR MOUNTING A MODULE AND ENABLING HEAT CONDUCTION FROM THE MODULE TO THE MOUNTING SURFACE") and which is referred to here as the '1028 Application;

U.S. patent application Ser. No. 61/060,589 (entitled "SUSPENSION METHOD FOR COMPLIANT THERMAL CONTACT OF ELECTRONICS MODULES") and which is referred to here as the '1029 Application;

U.S. patent application Ser. No. 12/137,307 (entitled "ANGLED DOORS WITH CONTINUOUS SEAL") and which is referred to here as the '1030 Application;

U.S. patent application Ser. No. 61/060,523 (entitled "L-SHAPED DOOR WITH 3-SURFACE SEAL FOR END-PLATES") and which is referred to here as the '1031 Application;

U.S. patent application Ser. No. 61/060,576 (entitled "L-SHAPED DOORS WITH TRAPEZOIDAL SEAL") and which is referred to here as the '1032 Application;

U.S. patent application Ser. No. 61/060,547 (entitled "COMBINATION EXTRUDED AND CAST METAL OUTDOOR ELECTRONICS ENCLOSURE") and which is referred to here as the '1034 Application;

U.S. patent application Ser. No. 61/060,584 (entitled "SYSTEMS AND METHODS FOR CABLE MANAGEMENT" and which is referred to here as the '1035 Application;

U.S. patent application Ser. No. 61/060,581 (entitled "CAM SHAPED HINGES") and which is referred to here as the '1037 Application;

U.S. patent application Ser. No. 12/137,313 (entitled "SOLAR SHIELDS") and which is referred to here as the '1038 Application;

U.S. patent application Ser. No. 61/060,501 (entitled "APPARATUS AND METHOD FOR BLIND SLOTS FOR SELF DRILLING/SELF-TAPPING SCREWS") and which is referred to here as the '1039 Application;

U.S. patent application Ser. No. 61/060,593 (entitled "SYSTEMS AND METHODS FOR THERMAL MANAGEMENT") and which is referred to here as the '1040 Application;

U.S. patent application Ser. No. 61/060,762 (entitled "SERF BOARD COMPONENTS") and which is referred to here as the '1062 Application; and U.S. patent application Ser. No. 61/060,740 (entitled "PULL-OUT SHELF FOR USE IN A CONFINED SPACE FORMED IN A STRUCTURE") and which is referred to here as the '1064 Application.

BACKGROUND

In the field of telecommunications, there is a trend to reduce both the size and the expenses associated with infrastructure equipment. The result is a demand on telecommunications infrastructure equipment providers to manufacture smaller equipment that can be operated and maintained in a more cost effective manner, while retaining all the functionality of legacy equipment. The modularity of designs proposed for such equipment, along with the smaller sizes desired by system operators, has introduced new thermal management challenges for dissipating heat generated by telecommunications infrastructure equipment. For the reasons stated above and for other reasons stated below which will become apparent to those skilled in the art upon reading and understanding the specification, there is a need in the art for improved systems and methods for thermal management of telecommunications infrastructure equipment.

SUMMARY

The Embodiments of the present invention provide methods and systems for thermal management of telecommunications infrastructure equipment and will be understood by reading and studying the following specification.

In one embodiment, a cooling unit for an enclosure housing electronics is provided. The cooling unit comprises: a fan shroud having at least one electrical fan; and a Venturi chamber having a first inlet for receiving a heated airflow from a heatsink, a second inlet for receiving an airflow from a surrounding environment, and an outlet coupled to the fan shroud, the fan drawing air from the Venturi chamber via the outlet when the fan is on. The Venturi chamber comprises a wall for directing the airflow air from the surrounding environment in from the second inlet and across the heated airflow from the heatsink in a manner to as to draw the heated airflow through the heatsink using a Venturi effect, when the fan is on.

BRIEF DESCRIPTION OF THE DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

This disclosure describes systems and methods for utilizing Venturi fan-assisted cooling of electrical equipment, such as but not limited to telecommunications equipment, housed inside an enclosure.

FIGS. 1A, 1B, 1C and 1D are diagrams illustrating an enclosure 100 of one embodiment of the present invention. Enclosure 100 comprises a structural backplane 105, two doors 110 that each pivot around respective hinges 115 and two endplates 112 attached respectively to the ends of structural backplane 105 so that when doors 110 are closed, a sealed environment is created within enclosure 100. In alternate embodiments, enclosure 100 provides a weatherproof sealed environment.

Figure 1A:
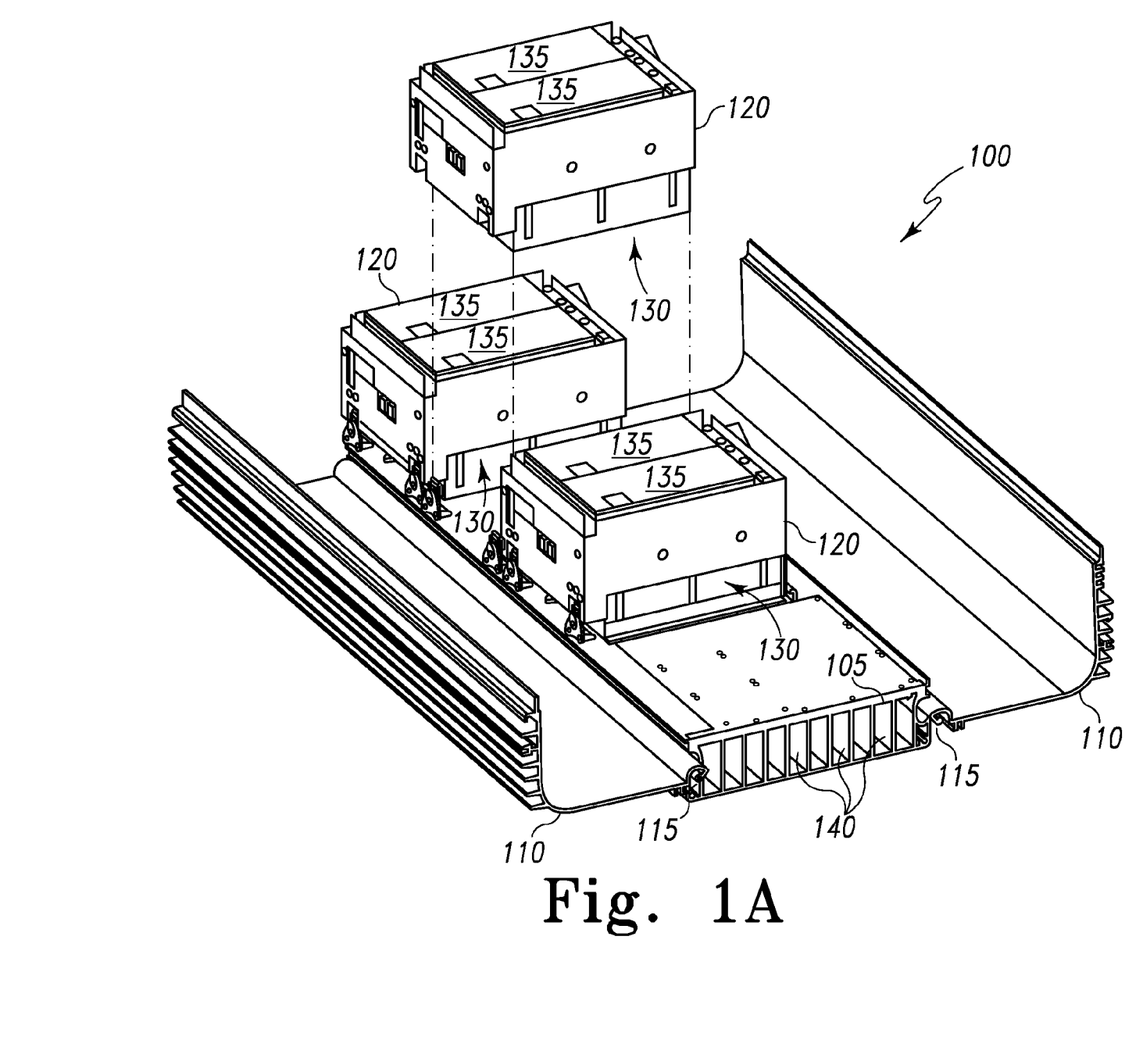
FIGS. 1A, 1B, 1C and 1D illustrate an enclosure of one embodiment of the present invention.

Enclosure 100 is shown in FIG. 1A with doors 110 in the open position and endplates 112 removed to reveal one or more electrical components 120 housed within enclosure 100. In the particular embodiment shown in FIG. 1A, electrical components 120 include, but are not limited to, the radiofrequency (RF) transceiver modules discussed in the '1027 Application and '1028 Application, both of which are herein incorporated by reference. In the particular embodiment shown in FIGS. 1A-1D, enclosure 100 is the enclosure described in the '1030 Application, herein incorporated by reference, wherein doors 110 are the described "L-shaped" doors which are sealed against backplane 105 by a continuous seal (not shown). Also, in the particular embodiment shown in FIGS. 1A-1D, hinges 115 are the cam-shaped hinges as described in the '1037 Application herein incorporated by reference.

Figure 1B:
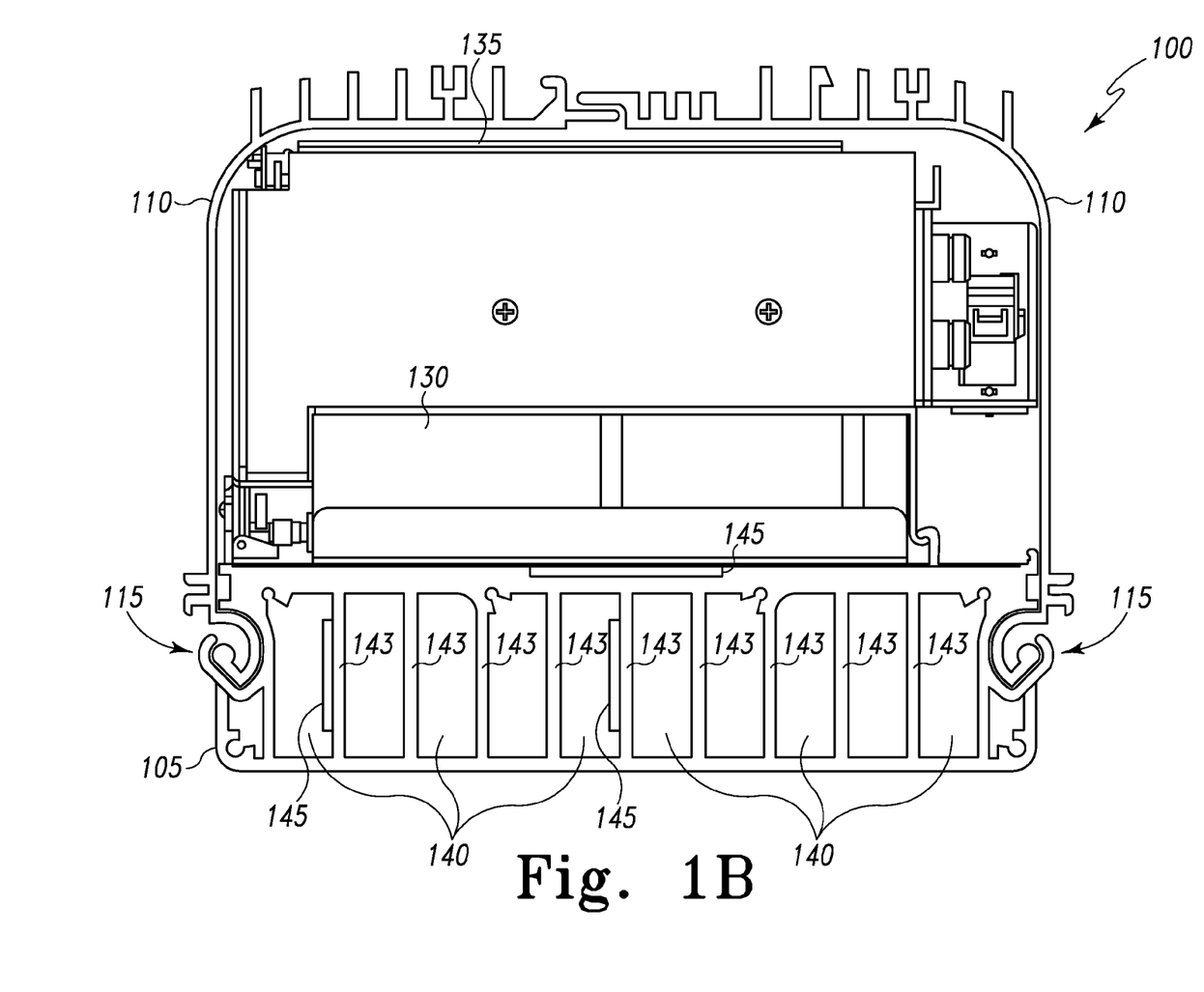
Figure 1C:
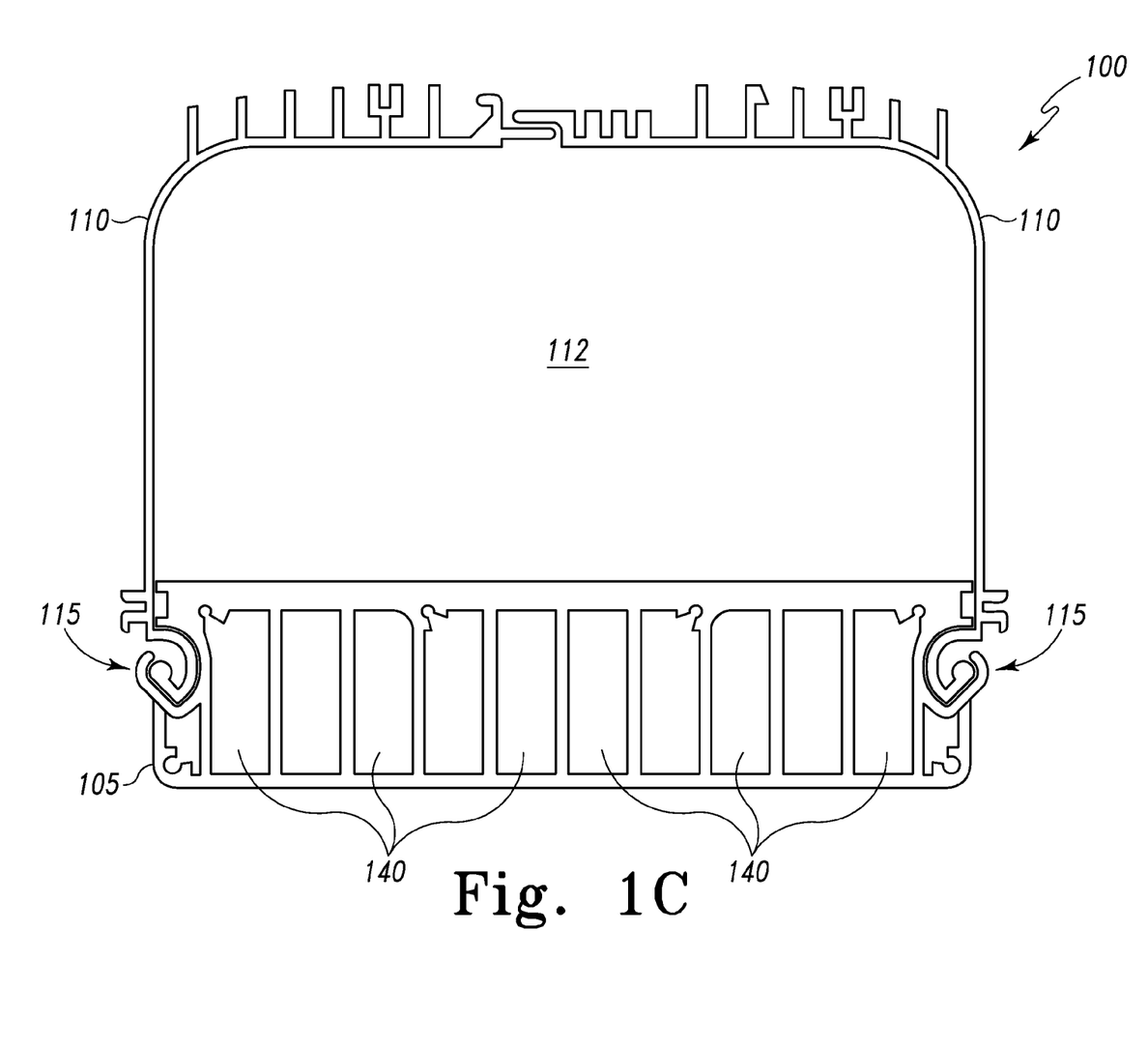
Figure 1D:
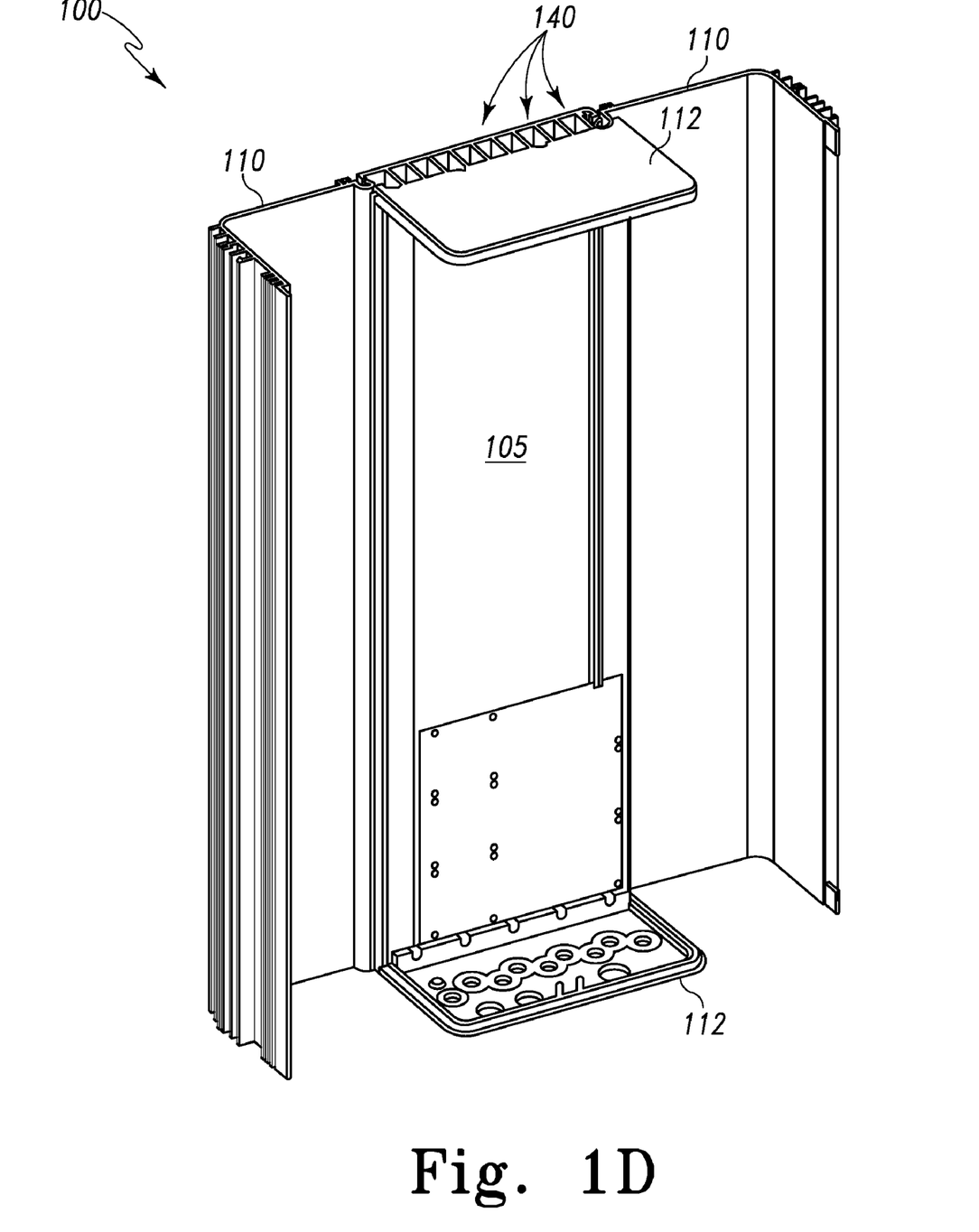

As explained in greater detail in the '1040 Application, herein incorporated by reference, electrical components 120 are designed so that high powered internal electronics (that is, those electronics generating the most heat) (shown generally at 130) are located to maximize the conductive transfer of that heat to backplane 105 which thus acts as a heatsink for the high powered internal electronics 130. In contrast, low power internal electronics (that is, components generating relatively less heat) (shown at 135) are placed to conductively transfer the heat they generate to doors 110, when then doors 110 are in their closed positions as shown in FIG. 1B. Backplane 105 thus functions as a high power thermal interface, or in other words a heatsink, that provides a path for absorbing heat generated by the high powered internal electronics 130 and transferring that heat to the environment surrounding enclosure 100. Doors 110 similarly function as a heatsink for the low powered internal electronics 135 to transfer their heat to the environment surrounding enclosure 100.

Figure 2A:
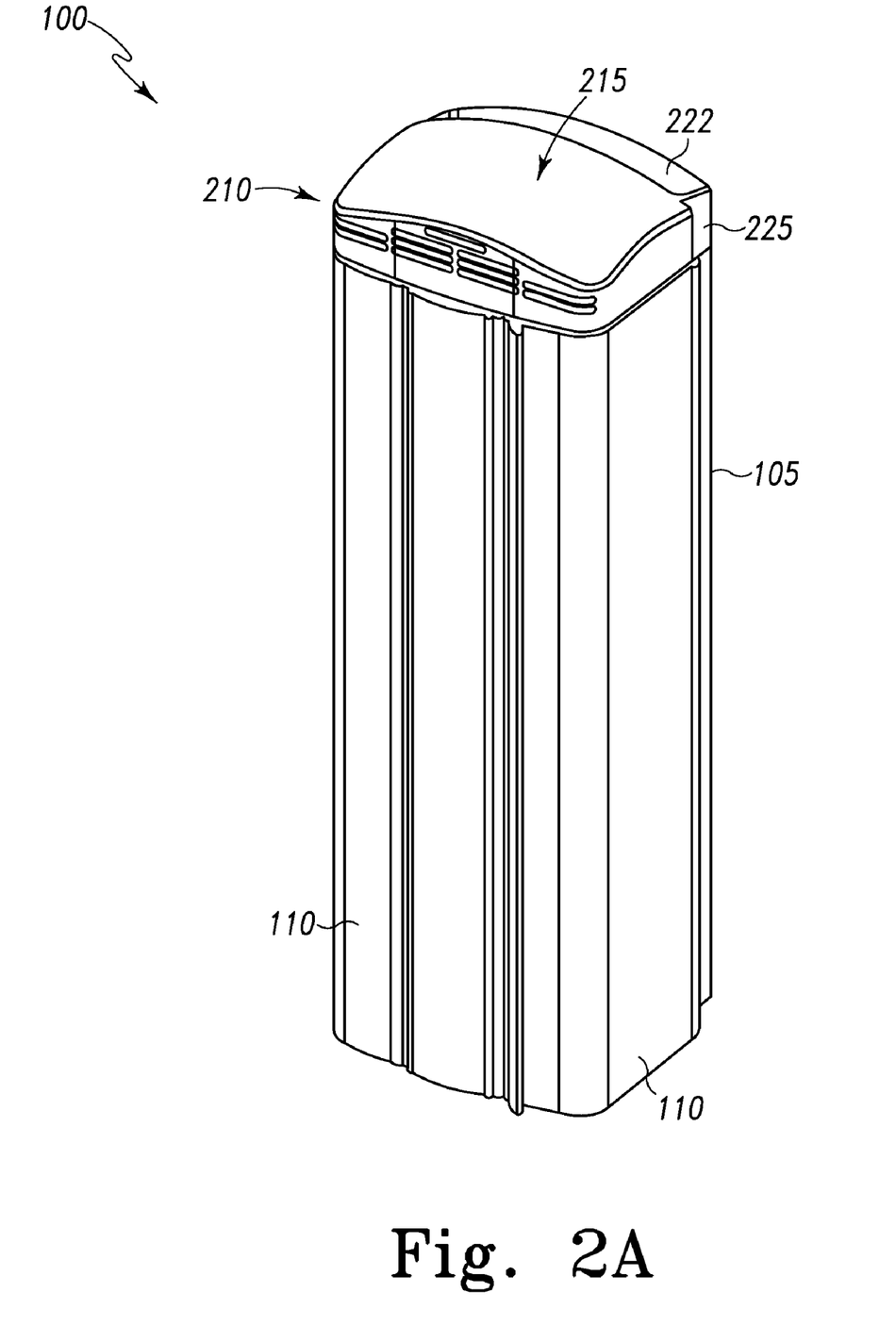
FIGS. 2A, 2B, 2C, 2D and 2E illustrate a Venturi assisted cooling unit for the enclosure of one embodiment of the present invention.
Figure 2B:
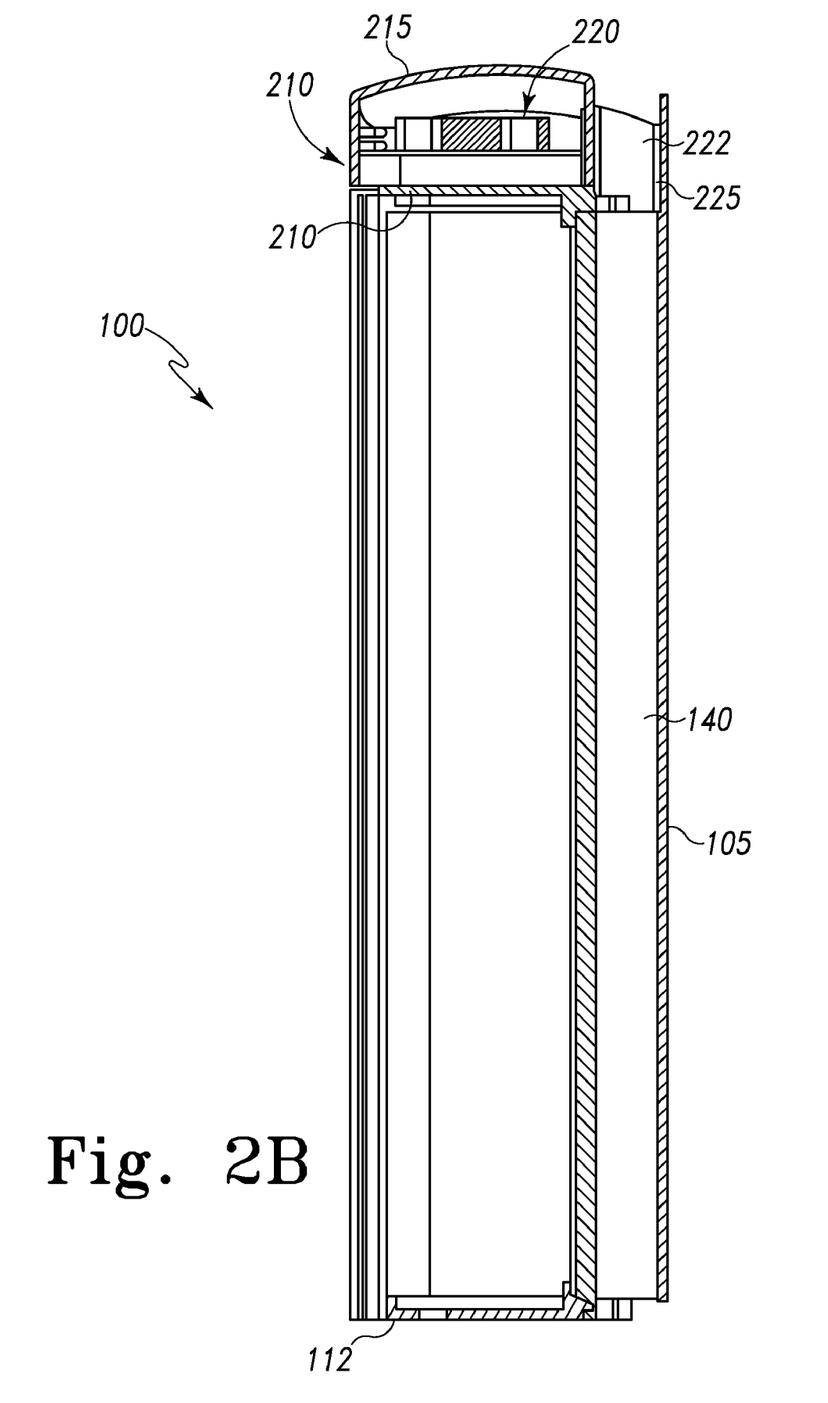
Figure 2C:
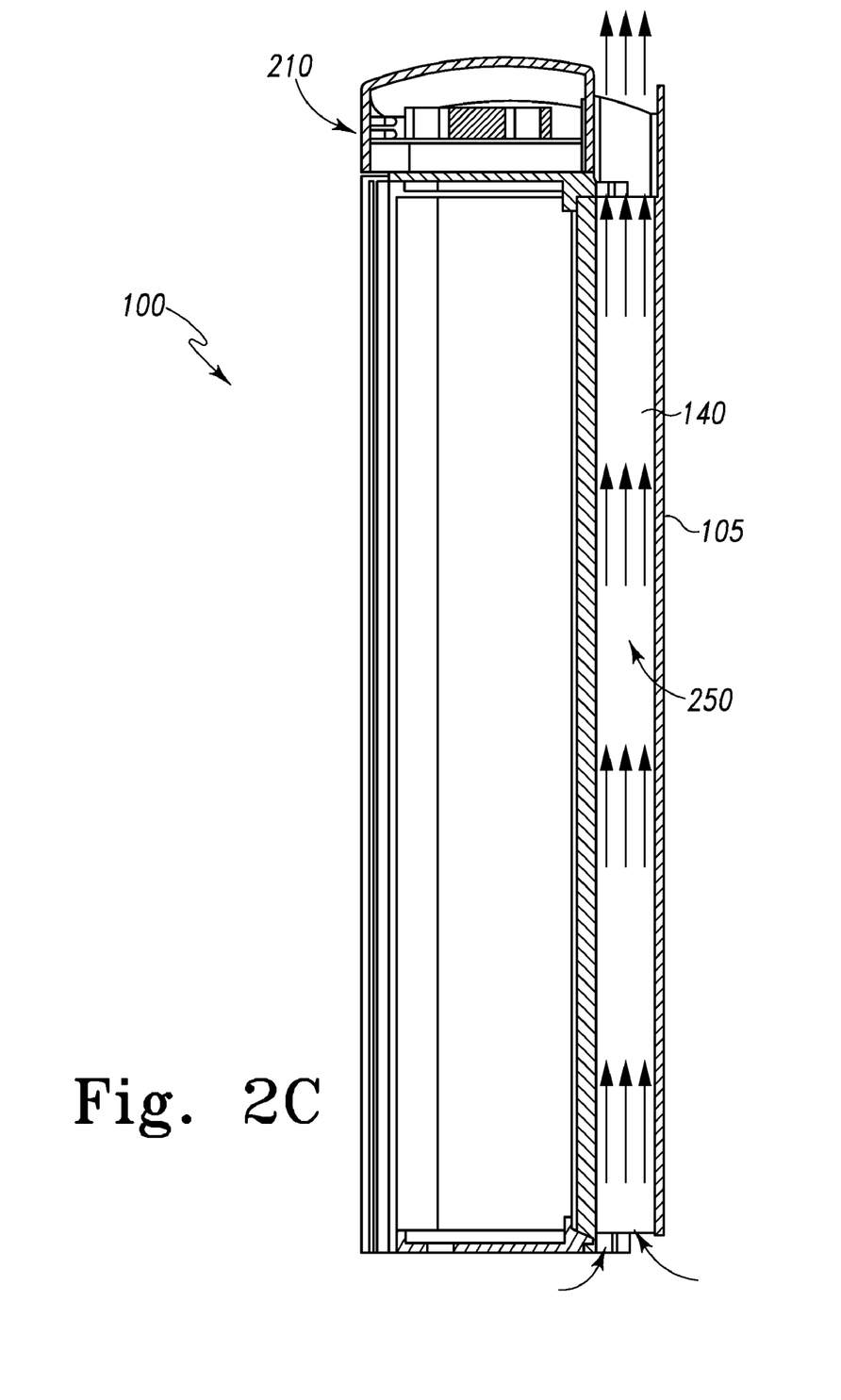

As shown in FIGS. 1A-1D, backplane 105 farther includes a plurality of convective openings 140 which comprise open voids that run the length of backplane 105 which promotes a natural convective heat transfer between backplane 105 and the air of the environment surrounding enclosure 100, some of which will naturally flow through convective openings 140 (illustrated in FIG. 2C). The base of the backplane heatsink can also be thermally enhanced by the use of advanced materials such as integral vapor chambers 145, which serve to evenly distribute the absorbed heat load through the backplane 105. Another embodiment would be use of the vapor chambers 145 as fins 143 of the heatsink. This would maximize the equivalent thermal conductivity of the fins 143, spreading the heat more evenly between the base and the integral shield of the backplane heatsink (high power heatsink). In one such embodiment, the vapor chambers 145 are installed and encapsulated into the base of the high-power heatsink, backplane 105. These vapor chambers 145 would be large, rectangular, copper stampings that would interface directly with the high power electronics in order to spread any focused load out, evenly, to all vertical fins 143 of the heatsink. In alternate embodiments, backplane 105 may also include a plurality of fins 143 running the length of backplane 105, either instead of, or in addition to, vapor chambers 145 for the purpose of further promoting heat exchange between backplane 105 and the air of the environment surrounding enclosure 100. In that case the open spaced between the fins at either end of backplane 105 would form similar convective openings.

Figure 2D:
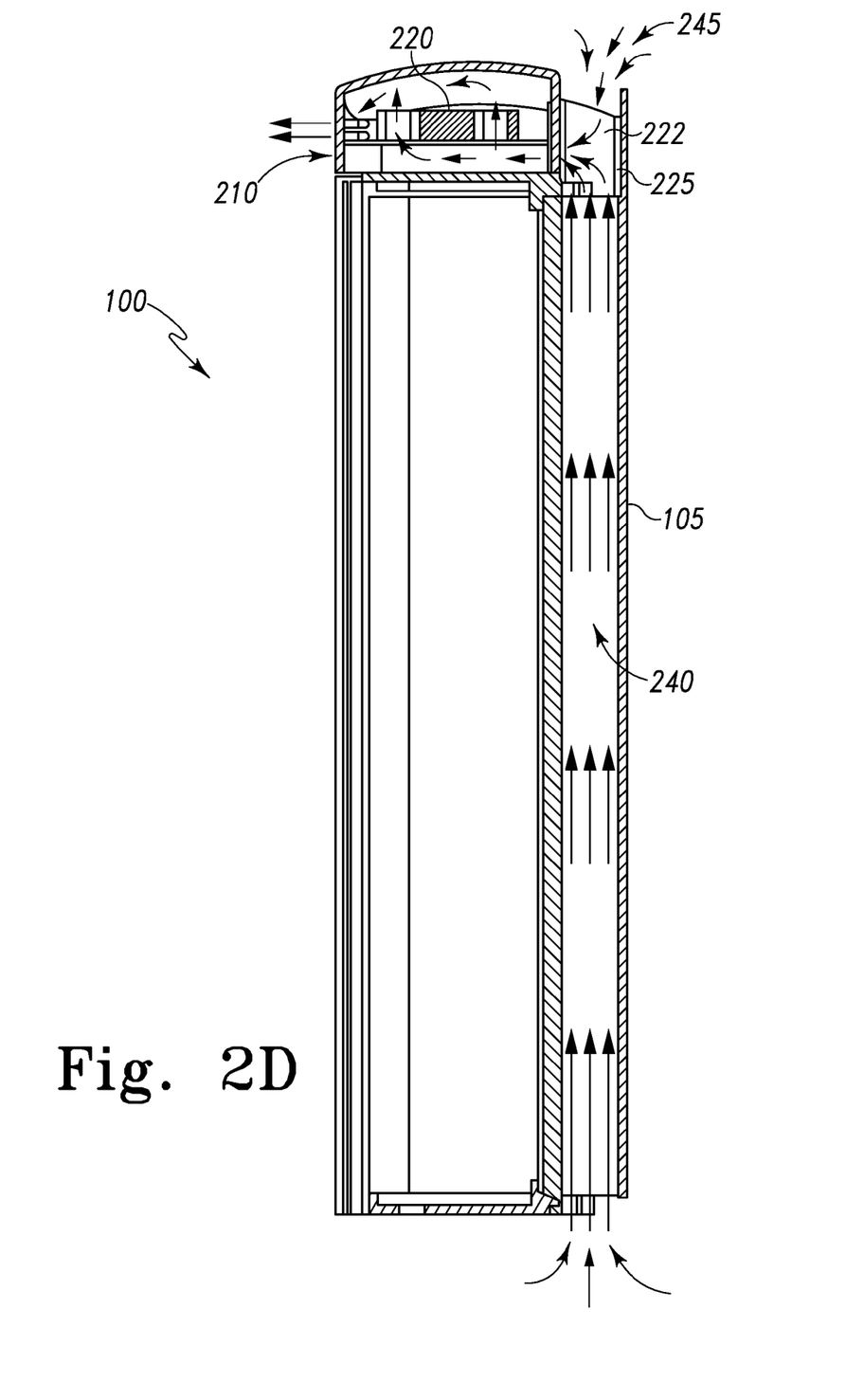
Figure 2E:
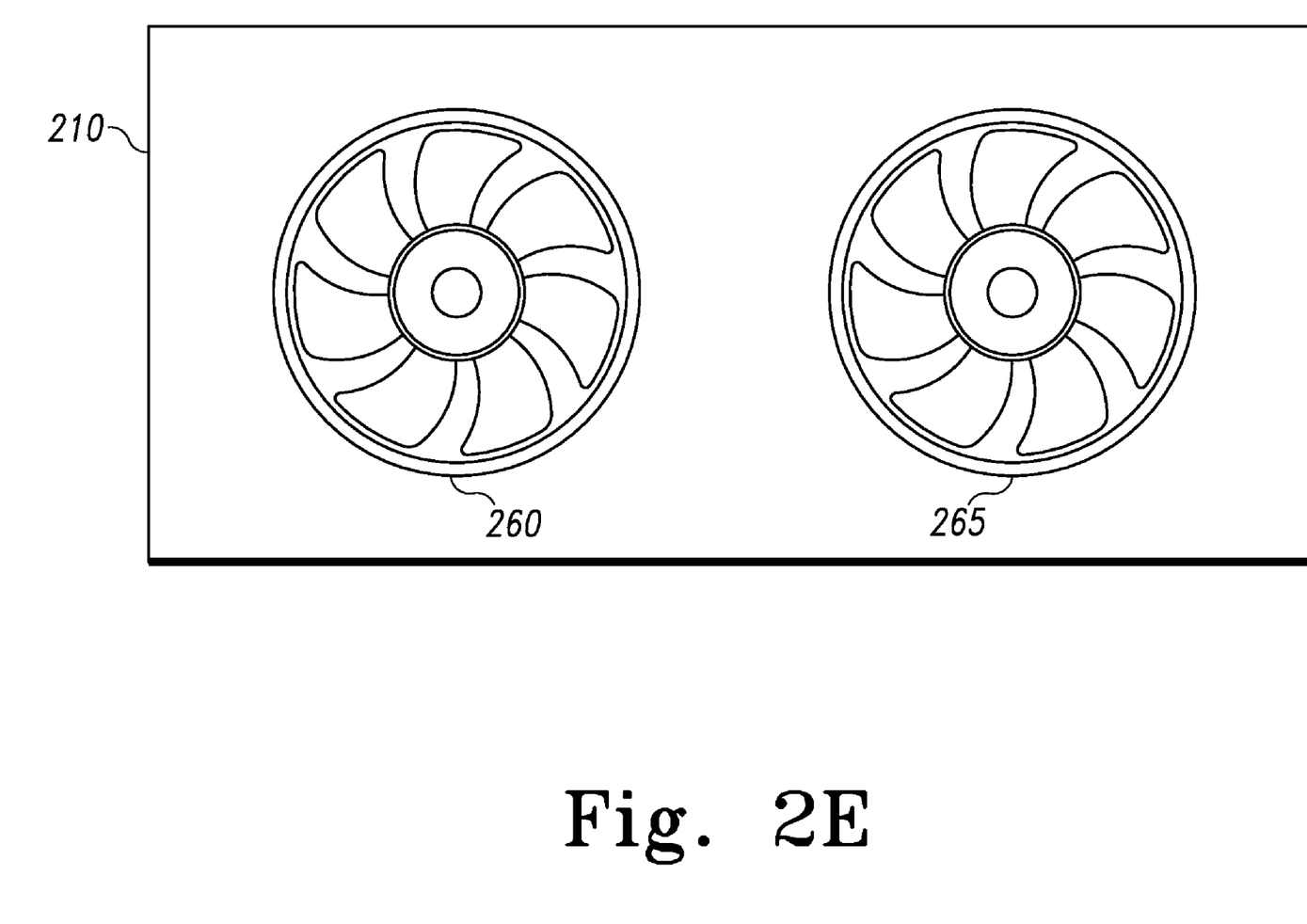

FIGS. 2A, 2B, 2C, 2D and 2E are diagrams illustrating an enclosure 100 (with doors 110 closed), the enclosure 100 further comprising a fan assisted cooling unit 210 of one embodiment of the present invention, placed at the top of enclosure 100. FIG. 2B illustrates a cut-away view of FIG. 2A. Fan assisted cooling unit 210 comprises a fan shroud 215 having at lest one electrical fan 220. As shown in FIG. 2E, in one embodiment, an assisted cooling unit 210 could include two fans with one fan being a primary fan 260 and the second fan 265 acting as a backup fan in case of the failure of the primary fan 260. One of ordinary skill in the art would appreciate that there are a number a methods to detect when the primary fan 260 has failed. For example, in one embodiment, a backup fan is provided a setpoint to activate at a temperature threshold that would not be reached under normal design expectations if the primary fan 260 was working properly.

Fan assisted cooling unit 210 further comprises a Venturi chamber 222 formed from a continuous wall 225 connected on each end to fan shroud 215. As shown in FIGS. 2B-2D, fan 220 is placed in an offset position outside of Venturi chamber 222 so as to not impede the natural circulation of air through convective openings 140 when fan 220 is not operating. Wall 225 extends upwards along the circumference of backplane 105 in order to encircle the top openings of convective openings 140 within Venturi chamber 222.

As shown in FIG. 2D, because of the placement of wall 225, air drawn into fan 220 must flow into Venturi chamber 222 either through the convective openings 140 of backplane 105 (shown generally by airflow 240), or drawn in from above Venturi chamber 222 (shown generally by airflow 245). The airflow 240 flowing up from backplane 105 will be heated by the heat dissipated from high powered internal electronics (130) and thus will be significantly more buoyant than the ambient air of airflow 245. As a result, fan 220 will draw in more air from backplane 105 than it is going to draw in from the top of Venturi chamber 222.

Fan 220 pulls in the hot buoyant air off the top of backplane 105 and at the same time air from the top of Venturi chamber 222. The air coming in from the top of Venturi chamber 222 is directed across the heated airflow from the heatsink by wall 225 and the draw of fan 222. The combination of drawing both the heated airflow 240 from backplane 105 and the ambient airflow 245 from above into Venturi chamber 222 and through fan 220 produces a Venturi effect. That is, the ambient airflow 245 flowing over the top of wall 225 generates an increased airflow in the heated airflow 240 coming from below—such as when air flows over the top of an open straw. With this configuration, cooling unit 210 works very efficiently as a pump to draw the hot air from the top openings of the convective openings 140 of backplane 105 which in turn draws in relatively cool ambient air in from the bottom openings of convective openings 140.

One of ordinary skill in the art, upon reading this specification, would be able to determine both the optimal volume of Venturi chamber 222 and the height of wall 225 using skills and knowledge they posses and based on the heat removal requirements of the particular application. For example, one of ordinary skill in the art upon reading this specification would recognize that every size of fan is rated to produce a given volumetric flow, and that the dimensions of Venturi chamber 222 can be adjusted to optimize the use of a particular fan and draw the desired volume of air through backplane 105 when the fan 220 is on. Further, the height of wall 225 should be limited to avoid unnecessarily impeding vertical airflow through the generation of air friction, which will decrease the Venturi effect pulling hot air from backplane 105. As shown in FIGS. 2A-2D, for that particular embodiment, wall 225 is dimensioned to be approximately flush with the top of fan shroud 215.

Embodiments of the present invention, such as the cooling unit 210 described above, have distinct advantages over systems where a fan is placed directly over backplane 105. As illustrated in FIG. 2D, air is drawn air through the heatsink of backplane 105 when the fan 220 is in operation. When fan 220 is not in operation, as illustrated by FIG. 2C, having offset fans creates the free space available above backplane 105 (that is, the absence of obstructions) which allows a natural convection flow (shown generally at 250) to establish itself through convective openings 140.

In one embodiment, fan 220 is controlled to cycle on and off based on temperature thresholds. For example, in one embodiment when the temperature is less than a predetermined threshold (85 degrees Fahrenheit for example), the fan 220 turns off and natural convection flow through backplane 105 is utilized to remove heat from enclosure 100. When the temperature exceeds another predetermined threshold (90 degrees Fahrenheit for example), fan 220 is turned on to initiate forced air cooling as described above. As one of ordinary skill in the art upon reading this specification would appreciate, the upper and lower temperature thresholds can be set to avoid undue cycling of the fan. In alternate embodiments, the temperatures measured to determine when to operate the fan can include, but are not limited to, temperatures based on an ambient environmental air temperature, temperatures based on heat loads generated within enclosure 100, or a combination of both.

Figure 3:
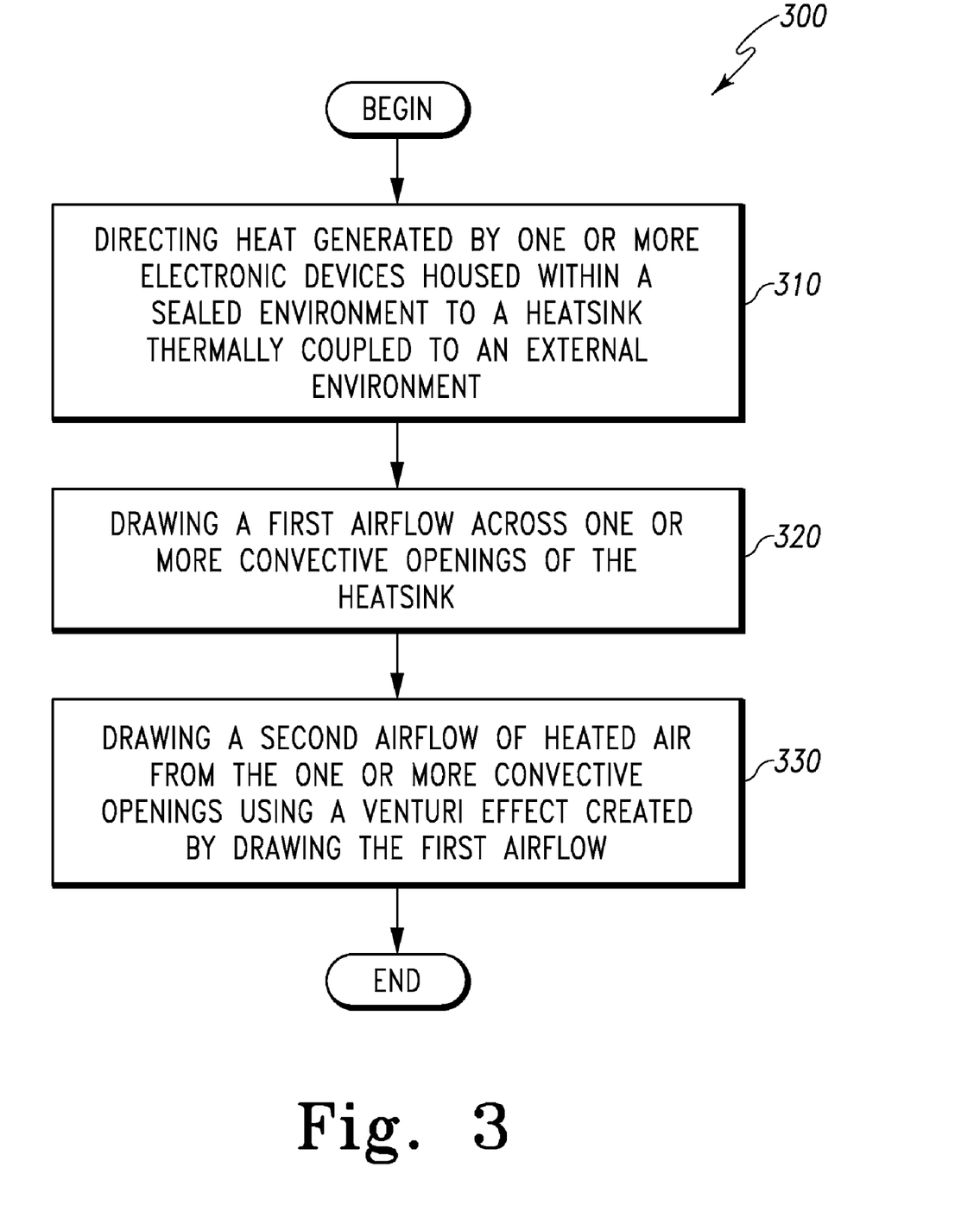
FIG. 3 is a flow chart illustrating a method of one embodiment of the present invention.

FIG. 3 is a flow chart illustrating a method 300 of one embodiment of the present invention for cooling an enclosure for housing electronics. The method begins at 310 with directing heat generated by one or more electronic devices housed within a sealed environment to a heatsink thermally coupled to an external environment. In one embodiment, the sealed environment is formed by closing one or more doors of an enclosure, such as enclosure 100 discussed above. In other embodiments, other sealed environments may be used. The heatsink includes one or more convective openings which comprise open voids that run the length of the heatsink which promotes a natural convection heat transfer between the heatsink and the air of the environment surrounding the enclosure, some of which will naturally flow through the convective openings. The convective opening allow air from the surrounding environment to convectively flow through the heatsink and transfer thermal energy generated by electronic components housed within the sealed environment to the external environment. In one embodiment, the convective openings are vapor chambers which also serve to evenly distribute the heat load generated by the electronic components throughout the heatsink.

The method proceeds to 320 with drawing a first airflow across one or more convective openings of the heatsink and to 330 with drawing a second airflow of heated air from the one or more convective openings using a Venturi effect created by drawing the first airflow. As explained in greater detail above with respect to FIGS. 2A-2D, the airflow flowing up from the heatsink's convective openings will be heated by the heat dissipated from high powered internal electronics and thus will be significantly more buoyant than the ambient first airflow. As a result, drawing the first airflow across the convective openings of the heatsink will establish a Venturi affect which will pull in more air through the heat sink than would flow naturally due to natural convection. In one embodiment, a fan draws in air from the top of a Venturi chamber to establish the first airflow. The first airflow is directed across the heated airflow from the heatsink by a wall of the Venturi chamber and the draw of the fan. The combination of drawing both the heated airflow from the heatsink and the ambient airflow from above is what produces the Venturi effect that generates an increased airflow through the heatsink which in turn draws in relatively cool ambient air in from the bottom side convective openings of the heatsink. In one embodiment, so as not to interfere with the natural convention of air through the heatsink when the fan is turned off, the fan is offset so that it is out of the path of the natural convection airflow. In alternate embodiments, the fan may be turned on and off based on one or more predetermined temperature thresholds as described in greater detail above.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. For example, electrical enclosures having only a single door, or multiple doors having shaped different from those described above are contemplated as within the scope of the present invention. Therefore, it is manifestly intended that this invention be limited only by the claims and the equivalents thereof.

What is claimed is:

1. A cooling unit for an enclosure housing electronics, the cooling unit comprising:
    a fan shroud having at least one electrical fan; and
    a Venturi chamber having a first inlet for receiving a heated airflow from a heatsink, a second inlet for receiving an airflow from a surrounding environment, and an outlet coupled to the fan shroud, the fan drawing air from the Venturi chamber via the outlet when the fan is on;
    wherein the Venturi chamber comprises a wall for directing the airflow air from the surrounding environment in from the second inlet and across the heated airflow from the heatsink in a manner to as to draw the heated airflow through the heatsink using a Venturi effect, when the fan is on.

2. The cooling unit of claim 1, wherein the fan shroud is offset from the Venturi chamber such that when the fan is not on, the fan shroud does not obstruct a natural circulation airflow entering the first inlet and exiting the second inlet of the Venturi chamber.

3. The cooling unit of claim 1, wherein the at least one electrical fan includes a primary fan and a backup fan that becomes operational upon a failure of the primary fan.

4. The cooling unit of claim 1, wherein the Venturi chamber first inlet encircles one or more convective openings of the heatsink.

5. The cooling unit of claim 1, wherein the airflow from the surrounding environment is cooler than the heated airflow.

6. An electronics enclosure, the enclosure comprising:
    a sealed environment housing electronics, the sealed environment having a heatsink for dissipating heat generated by the electronics to an external environment; and
    a cooling unit mounted above the sealed environment;
    wherein the cooling unit comprises:
        a fan shroud having at least one electrical fan; and a Venturi chamber having a first inlet for receiving a heated airflow from the heatsink and a second inlet for receiving an airflow from the external environment and an outlet coupled to the fan shroud, the fan shroud drawing air from the Venturi chamber via the outlet when the fan is on;

wherein the Venturi chamber comprises a wall for directing the airflow from the external environment in from the second inlet and across the heated airflow from the heatsink in a manner to as to draw the heated airflow through the heatsink using a Venturi effect, when the fan is on;

wherein the fan shroud is offset with respect to the Venturi chamber so as to not obstruct a natural circulation of air through the heatsink when the fan is not on.

7. The enclosure of claim 6, the heatsink forming a backplane; the sealed environment farther comprising:
at least one door pivotally attached to the backplane, wherein at least one electrical component is mounted to the backplane to conductively transfers heat to the backplane.

8. The enclosure of claim 6, the heatsink forming a backplane;
the enclosure further comprising:
at least two doors pivotally attached to the backplane; and
two endplates attached to the backplane;
wherein where the at least two doors are closed, the sealed environment is formed.

9. The enclosure of claim 6, the heatsink including a plurality of vapor chambers spreading the heat generated by the electronics to fins of the heatsink.

10. The enclosure of claim 6, wherein the Venturi chamber first inlet encircles one or more convective openings of the heatsink.

11. The enclosure of claim 6, wherein the fan shroud includes a primary fan and a backup fan that becomes operational upon a failure of the primary fan.

12. The enclosure of claim 6, wherein the fan shroud is offset from the Venturi chamber such that when the fan is not on, the fan shroud does not obstruct a natural circulation airflow entering the first inlet and exiting the second inlet of the Venturi chamber.

13. The enclosure of claim 6, wherein when the fan is on, air entering the Venturi chamber from the second inlet is cooler than air entering the Venturi chamber from the first inlet.

14. A method for cooling a sealed environment of an enclosure for housing electronics, the method comprising:

directing heat generated by one or more electronic devices housed within a sealed environment of an enclosure to a heatsink thermally coupled to an external environment;
drawing a first airflow across one or more convective openings of the heatsink, wherein the first airflow does not flow into the one or more convective openings of the heatsink;
drawing a second airflow of heated air from the one or more convective openings using a Venturi effect created by drawing the first airflow.

15. The method of claim 14 wherein drawing the first airflow further comprises drawing the first airflow into a Venturi chamber;
wherein drawing the second airflow further comprises drawing the second airflow into the Venturi chamber;
the method further comprising operating a fan to pull the first airflow and the second airflow out of the Venturi chamber.

16. The method of claim 14, further comprising operating a fan to draw the first airflow and the second airflow.

17. The method of claim 15, wherein the fan is located offset with respect to the Venturi chamber to not impede a natural circulation of airflow through the Venturi chamber when the fan is not in operation.

18. The method of claim 15, further comprising operating the fan when a temperature exceeds a predetermined threshold.

19. A method for cooling a sealed environment of an enclosure for housing electronics, the method comprising:
directing heat generated by one or more electronic devices housed within a sealed environment of an enclosure to a heatsink thermally coupled to an external environment;
when a temperature exceeds a first predetermined threshold, operating a fan to draw a first airflow across one or more convective openings of the heatsink and a second airflow of heated air from the one or more convective openings of the heatsink using a Venturi effect created by drawing the first airflow, wherein the first airflow does not flow into the one or more convective openings of heatsink;
when the temperature does not exceed a second predetermined threshold, allowing a natural circulation airflow to flow from the one or more convective openings of the heatsink by not operating the fan.

20. The method of claim 19, wherein the fan is located such as to not impede the natural circulation airflow when the fan is not in operation.

* * * * *